United States Patent [19]
Coldren et al.

[11] 4,128,616
[45] Dec. 5, 1978

[54] MICROPOSITIONERS USING A CRYSTAL HAVING MOVEABLE DOMAIN WALLS

[75] Inventors: Larry A. Coldren, Holmdel; Ross A. Lemons, Tinton Falls, both of N.J.

[73] Assignee: Bell Telephone Laboratories, Incorporated, Murray Hill, N.J.

[21] Appl. No.: 823,726

[22] Filed: Aug. 11, 1977

[51] Int. Cl.$^2$ .............................................. H01L 41/10
[52] U.S. Cl. ..................................... 310/328; 310/360
[58] Field of Search ........................ 310/360, 328, 311

[56] References Cited
U.S. PATENT DOCUMENTS

| | | | |
|---|---|---|---|
| 3,437,432 | 4/1969 | Borchardt | 310/311 X |
| 3,773,898 | 11/1973 | Aizu et al. | 310/360 X |
| 3,851,192 | 11/1974 | Flippen et al. | 310/360 X |
| 3,899,697 | 8/1975 | Cummins | 310/360 X |

*Primary Examiner*—Mark O. Budd
*Attorney, Agent, or Firm*—Ronald D. Slusky

[57] ABSTRACT

Objects are displaced with precision over very small distances by a micropositioner which includes a body of crystalline material having at least one domain wall. One end of the crystalline body is affixed to a base. An object to be moved is secured to the opposite end. The crystalline material is such that movement of the domain wall causes relative motion between the ends of the crystalline body, resulting in a displacement of the object with respect to the base. A ruled scale is disposed along the path of travel of each domain wall to indicate displacement over known, precisely controllable distances. In a first embodiment, the object is a microprobe and the crystalline body includes a single domain wall. Movement of the latter provides linear motion of the microprobe. In another embodiment, the object is an electron microscope grid assembly. Here the crystalline body includes two domain walls, allowing two-dimensional planar motion of the assembly.

19 Claims, 5 Drawing Figures

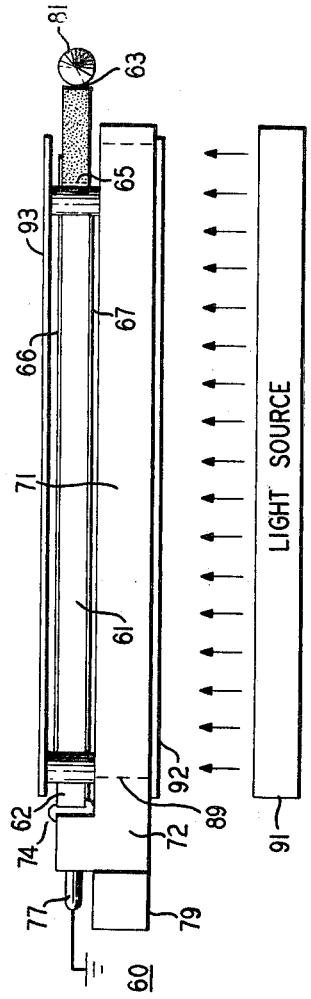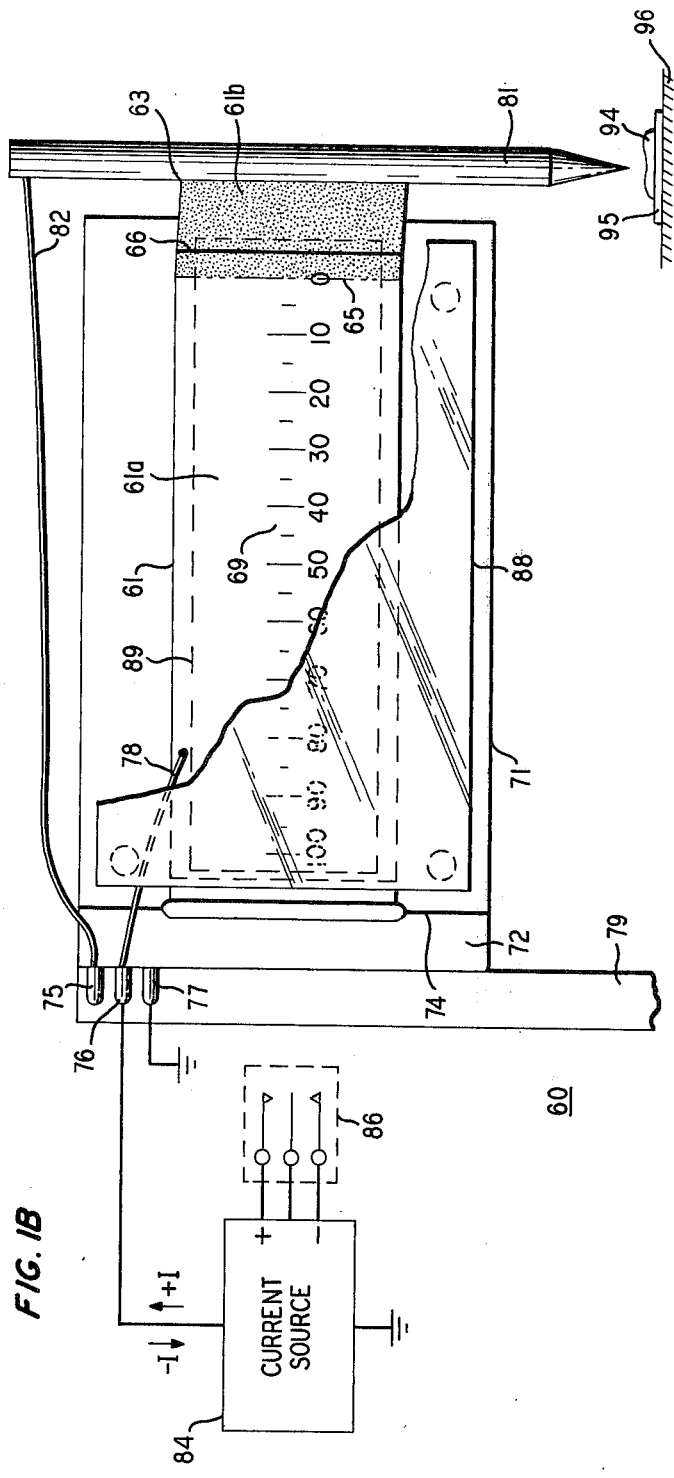
FIG. 1A
FIG. 1B

MICROPOSITIONERS USING A CRYSTAL HAVING MOVEABLE DOMAIN WALLS

BACKGROUND OF THE INVENTION

Our invention relates to apparatus for moving objects with precision over very small distances. The prior art of which we are aware teaches two basic types of such devices, herein referred to as "micropositioners." The first is a wholly mechanical arrangement in which screw threads and the like are used to translate the relatively gross motion of an operator's hand into a much smaller movement, or displacement, of the object to be moved. Disadvantageously, there is a limit to the precision with which mechanical parts can be machined. This, in turn, limits the precision to which displacements can be achieved (without resort to complex mechanical structures), typical displacement resolution being 2-5 microns.

Other micropositioners exploit in a straightforward way the fact that piezoelectric materials, for example, undergo a change in physical dimension when a voltage is impressed across them. Advantageously, these relatively simple devices can provide much more precise displacements than simple mechanical arrangements, typical displacement resolution being 0.001 microns. They have a number of drawbacks, however. Their maximum displacement is in the 10 micron range, which is insufficient for many applications, and which is achieved only by using very high voltages—a further disadvantage. Moreover, displacement as a function of applied voltage may be (a) nonlinear and (b) unstable over time. These factors make difficult precise control over, and readout of, the displacement. A further disadvantage is that the piezoelectric devices require a continuously applied voltage in order to maintain the displacement.

SUMMARY OF THE INVENTION

Micropositioners embodying the principles of our invention incorporate many of the advantageous features of those known heretofore, while avoiding many of their disadvantages. At the heart of our device is a monolithic body of a crystalline material of the type in which regions, or "domains," of drifting crystal axis orientations—each domain interfacing with another at a planar "domain wall"—can coexist stably. A further characteristic of the materials used is that the domain walls can be moved through the crystalline body by applying relatively low amplitude control signals thereto and that that motion results in relative motion between the non-interfacing domain ends. Materials having these properties include rare earth molybdates, such as those of gadolinium and terbium. The crystalline body has a fixed end and a free end, with the object to be moved being secured to the latter. Thus, application of a control signal to the crystalline body to move a domain wall effects movement of that object with respect to the fixed end. When the control signal is removed, the domain wall, and thus the object, advantageously remain fixed in their current positions. Typical displacement resolution achieved in a device in accordance with the invention is 0.005 micron; typical full displacement is 100 microns.

A first illustrative embodiment of our invention includes two domains, i.e., a single domain wall. A specimen to be probed is received by a structure which is maintained in fixed relationship to the fixed end. The free end illustratively carries a microprobe. Thus, movement of the domain wall provides relative motion between the specimen and the microprobe, illustratively along a straight line. A second illustrative embodiment includes three domains, with the two domain walls being orthogonal to each other. The object affixed to the free end is illustratively an electron microscope grid assembly. The two domain walls are independently movable in response to respective control signals, providing two-dimensional motion within a plane between a specimen received by the grid assembly and the fixed end.

The amount by which the free end of the crystalline body is displaced is a small, constant fraction of the domain wall displacement which fraction is stable over time. Advantageously, in accordance with a feature of our invention, a ruled scale may be disposed along the line of travel of each domain wall, the scale being marked in units of displacement of the free end with each scale unit being much larger than the corresponding physical displacement. This allows the free end to be displaced over known, precisely controllable distances by observation of the position of the domain wall with respect to the scale markings.

BRIEF DESCRIPTION OF THE DRAWING

The drawing shows the two above-mentioned illustrative embodiments of our invention. In particular:

FIGS. 1A and 1B are bottom and front views, respectively, of a micropositioner in accordance with the invention which provides linear motion of a microprobe;

DETAILED DESCRIPTION

Figure 2:
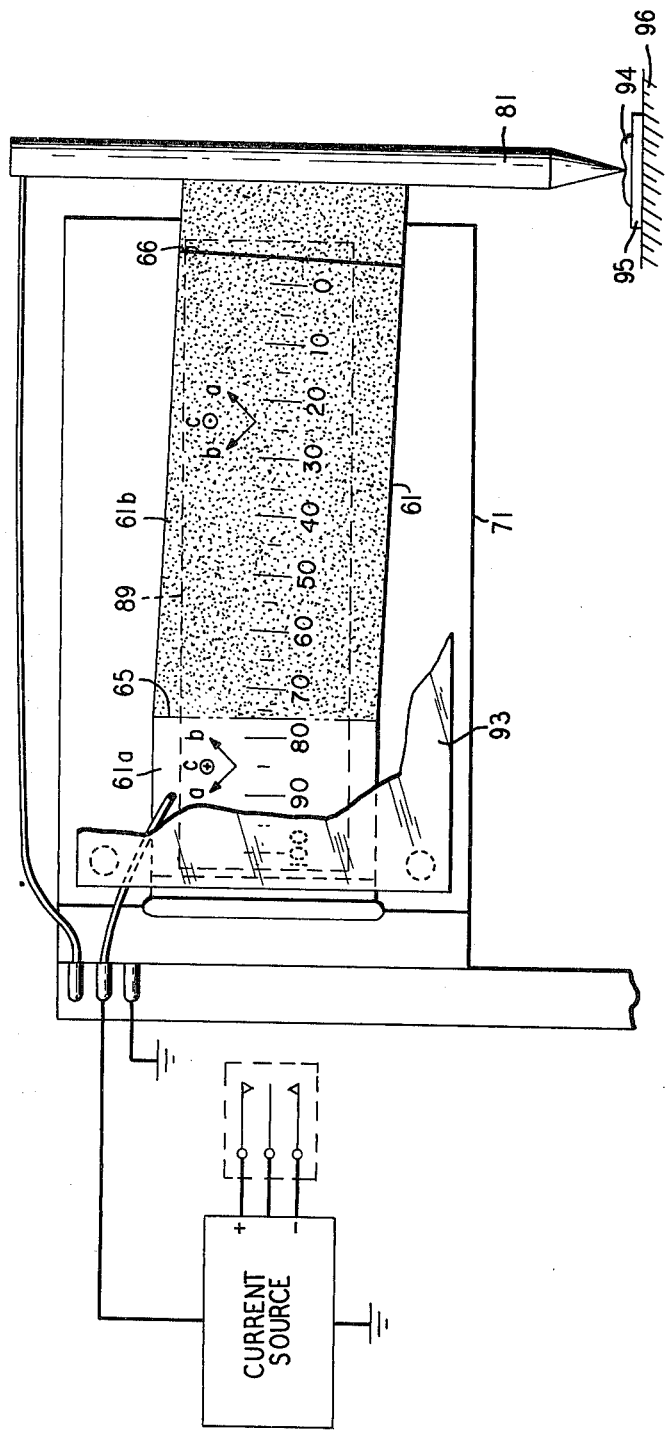
FIG. 2 is a front view of the same micropositioner with the microprobe extended.

Micropositioner 60 of FIGS. 1A and 1B includes a crystalline body 61 having a fixed end 62 and an opposing free end 63. Fixed end 62 is bonded to shoulder 72 of a metallic base 71, illustratively by way of conductive bonding material 74. A microprobe 81 is secured to end 63. Base 71 is secured to a vertical member 79 which may be mounted to a support (not shown) which allows the micropositioner to be pivoted about the axis of member 79 and clamped at a desired position. A specimen 94 to be probed is received on a surface 95, which is maintained in fixed relationship to the edge of end 62 by support 96.

Crystalline body 61 may be, for example, on the order of 30 mm long, 6.0 mm wide and 0.5 mm thick. It includes first and second regions, or "domains," 61a and 61b in which two of the crystal axes, illustratively the a and b axes, are interchanged. That is, the orientation of the a axis in one domain is substantially the same as the orientation of the b axis in the other domain and vice versa. Domains 61a and 61b interface at a planar domain wall 65—a very narrow region of the crystal in which the a and b axis interchange takes place. The orientation of domain wall 65 with respect to the crystal axes, illustratively approximately 45° to each, is an invariant characteristic of the crystalline material selected for body 61.

More particularly, the crystalline material of body 61 may be, for example, a rare earth molybdate such as terbium molybdate or gadolinium molybdate, both of which are coupled ferroelectric-ferroelastics. In these materials, the $c$ axis is the polar axis and the $a$, $b$ and $c$ axes always maintain the same relationship to one another, following, for example, the right-hand rule. This is illustrated in FIG. 2, which shows the $c$ axis illustratively pointing into the plane of the drawing in domain 61a and out of the plane in domain 61b. A further property of these materials is that the application of a control signal along the $c$ axis across a region of the crystal which includes a domain wall reverses the polarity of the $c$ axis—and therefore effects an interchange of the $a$ and $b$ axes—immediately adjacent one side of the domain wall or the other, depending on the polarity of the applied signal. This, by definition, effects a movement of the domain wall.

A pair of electrodes 66 and 67 are disposed on opposing surfaces of body 61 such that they intersect the $c$ crystal axis over the desired region of travel of domain wall 65. Electrodes 66 and 67 are illustratively comprised of 300Å thick chromium evaporated onto the surface of body 61. They, like body 61, are translucent. Ground potential is extended to electrode 67 by way of an electrical path comprising input pin 77, shoulder 72 and conductive bonding material 74. Control signals for moving wall 65 are applied to electrode 66 from input pin 76 by way of lead 78. The control signals themselves are provided from a dc signal source, illustratively a constant current source 84, which provides an output current of magnitude I in response to operation of momentary contact SPDT switch 86. When it is desired to move wall 65 to the right, for example, switch 86 is moved to the up position, causing a positive current, $+I$, to flow into electrode 66 and through body 61 to ground by way of electrode 67. When switch 86 is in the down position, by contrast, a negative current, $-I$, flows, moving wall 65 to the left. The magnitude of current I may be on the order of 10 nanoamperes. The voltage compliance of the current source must exceed a minimum level, determined principally by the crystal thickness and coercive field of the material. Once the wall has reached a desired location, switch 86 is simply released and the wall remains in that location. Advantageously, driving the device with a constant current provides a uniform wall velocity, making it easier for an operator viewing the domain wall (as described below) to follow its progress and release switch 86 at just the right moment. A dc, i.e., constant, voltage source could, alternatively, be used in place of source 84. However, uniform wall velocity would not be assured.

The present invention exploits what was heretofore thought to be a disadvantageous property of the crystalline materials in question: As the result of asymmetry in the crystal stucture, movement of the domain wall causes the crystalline body to deform so as to create relative motion between the two domains. In gadolinium and terbium molybdates, in particular, every point in the moving domain is displaced along a line parallel to the domain wall. In micropositioner 60, then, movement of domain wall 65 from right to left causes relative motion between ends 62 and 63. Since the position of end 62 is fixed, relative motion occurs between specimen 94 and free end 63, whereby probe 81 moves parallel to wall 65 toward specimen 94. Since body 61 is affixed to base 71 only at end 62, domain 61b is able to slide adjacent the surface of the base as wall 65 moves.

FIG. 2 shows micropositioner 60 with wall 65 displaced most of the way across body 61. The extent of deformation of the crystalline body and the resultant downward distance traveled by probe 81 to contact specimen 94 have been exaggerated for clarity. For a 30 mm long crystalline body, for example, the probe travel may be on the order of 0.1 mm, i.e., 100 microns. More generally, probe displacement is a small, constant, stable fraction of domain wall dislacement which is determined by the crystal structure.

Light from a source 91 is shone onto the back of body 61 by way of a first polarizer 92 and a slot 89 extending through base 71. A second polarizer 93 is supported above body 61. Polarizers 92 and 93 are oriented in different, e.g., orthogonal, directions. This arrangement makes the domain wall visible, enabling its position to be observed by a human viewer or, in an automated system, by light-sensitive detection circuitry. In accordance with an advantageous feature of our invention, micropositioner 60 includes a ruled scale 69 disposed along the line of travel of domain wall 65, i.e., perpendicular thereto. This scale is calibrated such that the position of the domain wall indicates the distance which probe 81 has been moved from the fully retracted, group, position shown in FIG. 1B, with each scale unit being much larger than the corresponding physical displacement.

Techniques other than the use of a calibrated scale for positioning domain wall 65 are also possible. See, for example, our copending patent application with A. M. Glass, No. 783,056, filed Mar. 30, 1977. The approach disclosed herein, however, is perhaps the simplest and easiest way to provide displacements over known, precisely controllable distances.

One typical use of micropositioner 60 might be in conjunction with biological experiments in which it is desired to electrically probe small specimens such as specimen 94. To this end, an electrical connection is illustratively provided for probe 81 to output (or, depending on the experiment, input) pin 75 by way of lead 82. The application and measurement of signals internal to an integrated circuit is another possible application for micropositioner 60.

Figure 3A:
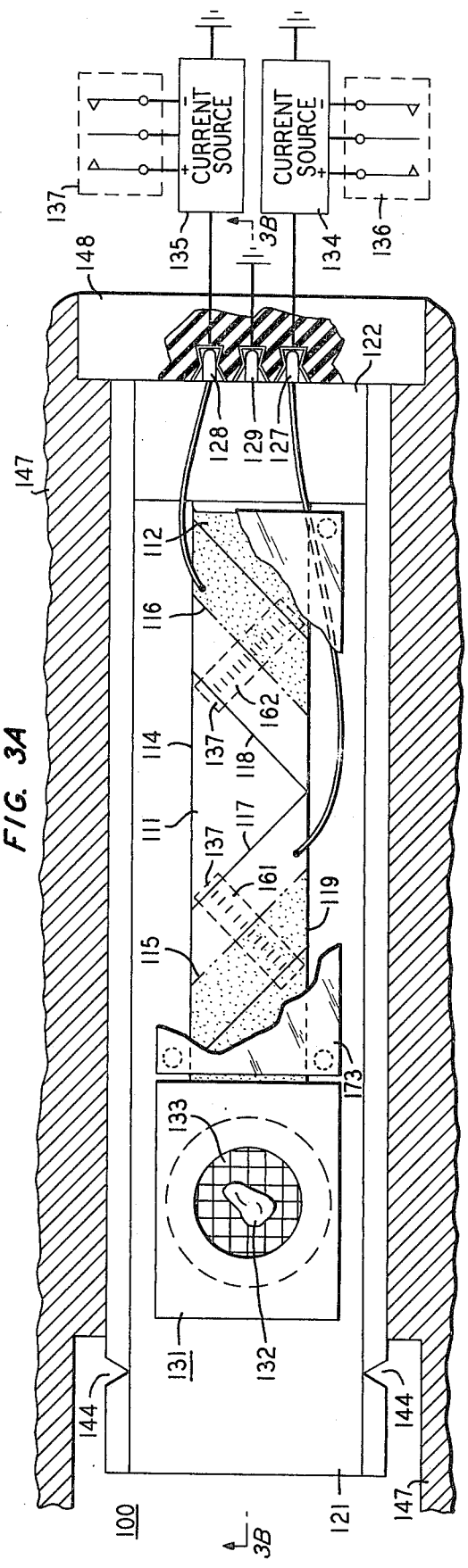
FIGS. 3A and 3B are top and cross-sectional views, respectively, of a micropositioner in accordance with the invention which provides planar motion of an electron microscope grid assembly.
Figure 3B:
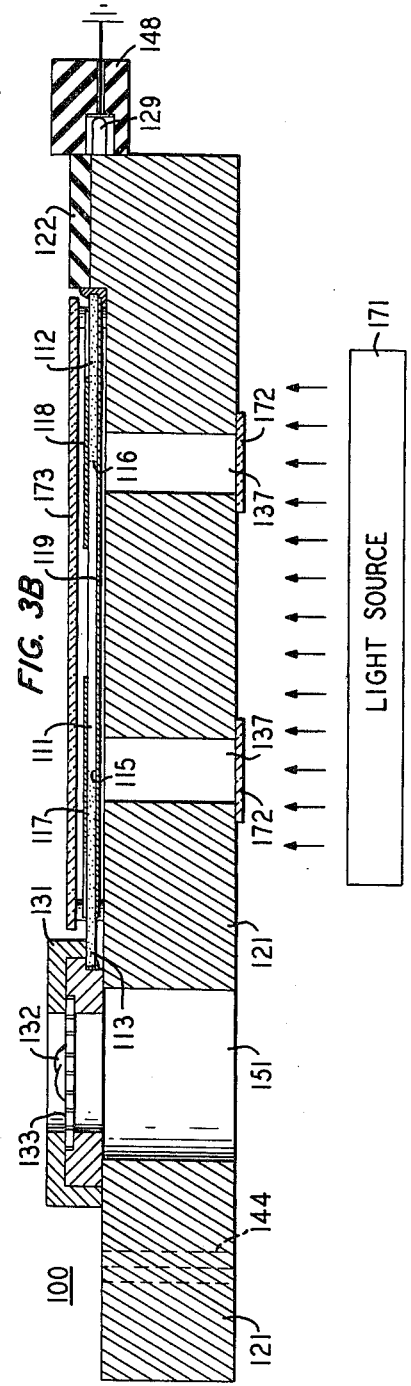

FIGS. 3A and 3B show a second embodiment of our invention, micropositioner 100. A crystalline body 111, which may have dimensions on the same order of magnitude as those of body 61 of micropositioner 60, rests on a base 121. A fixed end 112 of body 111 is secured to shoulder 122 of base 121. An electron microscope grid assembly 131 is bonded to the opposing, free end 113 of body 111, providing a fixed relationship between assembly 131 and end 113. Assembly 131 rests on base 121 and is aligned with cylindrical hole 151 formed in the base. The entire micropositioner 100 is adapted to be slid into a housing 147 within an electron microscope such that the electron beam passes through grid assembly 131 and hole 151, allowing microscopic inspection of a specimen 132 received on wire grid 133. Notches 144 are provided in base 121 to facilitate insertion of the micropositioner within housing 147 by way of a grasping tool. The entire housing, in turn, is movable by mechanical means (not shown) to provide relatively coarse alignment of specimen 132 within the microscope field of view.

Final, precise alignment of the specimen is achieved by way of domain wall movement within body 111 in accordance with our invention. In particular, body 111 includes two domain walls 115 and 116, which lie at right angles to one another. Domain walls 115 and 116 have respective upper electrodes 117 and 118 and share a common lower electrode 119 which extends across substantially the entire lower face of body 111. The domain walls are both shown at the midpoints of their respective paths of travel, for which edges 114 and 119 are, illustratively, substantially straight. (This is simply achieved by cutting and polishing edges 114 and 119.) Connections are made from electrodes 117-119 to pins 127-129, respectively, in a manner similar to that described above in connection with micropositioner 60. Pins 127-129, in turn, engage connector 148 disposed at the end of housing 147.

Control signals for moving domain walls 115 and 116 are provided from constant current sources 134 and 135 by way of switches 136 and 137, respectively. Since walls 115 and 116 are perpendicular to one another, grid assembly 131 is carried in mutually orthogonal directions in response to individual movement of the two domain walls, thereby providing relative motion in two dimensions between specimen 132 and fixed end 112. Assembly 131 can thus be moved to any point within a small planar region. Individual calibrated scales 161 and 162 are illustratively disposed along the paths of travel of domain walls 115 and 116 to provide a way of precisely controlling the motion of assembly 131 over known distances. A light source 171, lower polarizers 172, upper polarizer 173 and channels 137 enable the domain walls to be observed.

Fabrication of the micropositioner disclosed herein requires, of course, that the crystalline body includes the desired number of domain walls. To this end, a domain wall may be created in the crystalline body by first squeezing along a pair of parallel edges to create a single domain. The device should be immersed in a slightly conductive liquid at this time to allow the ferroelectric polarization charge to flow. With the body still immersed, a corner of the body is pressed against a fixed object. This will nucleate a first domain wall near that corner. Continued pressure on the corner will cause the wall to propagate toward the center of the body to the desired location. This process can be repeated as often as necessary to nucleate the number of domain walls desired. Once the body is removed from the conductive liquid, the domain walls will remain where they are positioned.

Although specific embodiments of our invention are disclosed herein, it will be appreciated that numerous other arrangements may be devised by those skilled in the art without departing from the spirit and scope of the invention.

What is claimed is:

1. In combination,
    means for receiving a specimen,
    a body having a fixed end and a free end,
    control means for providing relative motion between said specimen and an individual one of said ends, said body being comprised of a body of crystalline material having at least a first domain wall, said material being such that movement of said domain wall causes relative motion between said fixed and free ends, said control means comprising means for moving said domain wall, and
    means for enabling the position of said domain wall to be observed,
    said combination characterized by a ruled scale disposed on said body perpendicular to the plane of said domain wall.

2. The invention of claim 1 wherein said domain wall is substantially planar, wherein a first crystal axis with said body is oriented in a predetermined direction on one side of said domain wall and a second crystal axis is oriented substantially in said direction on the other side of said domain wall and wherein said crystalline material is such that the application of an electrical signal through the plane of said first and second axes in a portion of said body which includes said domain wall effects an interchange of said first and second axes immediately adjacent said domain wall.

3. The invention of claim 2 further comprising means for securing said receiving means to said free end.

4. The invention of claim 2 further comprising an elongate member secured to said free end and extending beyond at least one edge thereof.

5. The invention of claim 2 wherein said means for moving said domain wall includes at least a first pair of electrodes disposed on opposing surfaces of said body such that they intersect the plane of said domain wall and means for applying an electrical control signal to said electrodes.

6. The invention of claim 5 wherein said crystalline material is a rare earth molybdate.

7. The invention of claim 1 wherein said enabling means includes means for illuminating one of said opposing surfaces through a first polarizer and a second polarizer disposed adjacent the other of said opposing surfaces.

8. The invention of claim 5 further comprising at least a first dc signal source for generating said electrical control signal, said signal source including means for switching the polarity of said signal.

9. A micropositioner for use in conjunction with means for receiving a specimen comprising
    a monolithic body of a crystalline material having a fixed end and a free end and including at least a first planar domain wall, said crystalline material being such that movement of said domain wall causes movement of said free end, and
    a pair of electrodes disposed on opposing surfaces of said body such that they intersect the plane of said domain wall, said crystalline material being such that the application of a control signal to said electrode pair causes movement of said domain wall,
    means for maintaining said specimen receiving means in fixed relationship to an individual one of said ends,
    means for enabling the position of said domain wall to be observed, and
    a ruled scale disposed on said body perpendicular to the plane of said domain wall.

10. The invention of claim 9 wherein said maintaining means includes means for securing said specimen receiving means to said free end.

11. The invention of claim 9 wherein said maintaining means includes means for maintaining at least one edge of said fixed end in fixed relationship to said specimen receiving means.

12. The invention of claim 9 wherein said material has a polar axis parallel to the plane of said domain wall and first and second nonpolar axes oriented in first and second directions, respectively on one side of said domain wall and oriented in said second and first directions, respectively, on the other side of said domain wall and wherein said application of a control signal to said electrode air effects an interchange of said nonpolar axes immediately adjacent one side or the other of said domain wall, depending on the polarity of said control signal.

13. The invention of claim 12 further comprising a dc signal source for providing said control signal at a selected polarity.

14. A micropositioner comprising
a monolithic body of a crystalline material having a fixed end and a free end and including at least first and second substantially nonparallel planar domain walls, said crystalline material being such that movement of said first and second domain walls causes movement of said free end in first and second substantially nonparallel directions, respectively, and a plurality of electrodes disposed on said body such that the plane of each of said domain walls is intersected by two of said electrodes, said crystalline material being such that the application of an electrical control signal between the electrodes which intersect the plane of a selected domain wall causes movement of that domain wall.

15. The invention of claim 14 further comprising means disposed in proximity to said free end for receiving a specimen.

16. The invention of claim 15 further comprising means for securing said receiving means to said free end.

17. The invention of claim 15 further comprising first and second dc signal sources for providing first and second control signals between the electrodes which intersect the planes of said first and second domain walls, respectively.

18. The invention of claim 17 further comprising first and second ruled scales disposed on said body perpendicular to the planes of said first and second domain walls, respectively, and first and second polarizer means for enabling said domain walls to be observed, said polarizer means being disposed in proximity to respective opposing surfaces of said body.

19. The invention of claim 15 wherein said crystalline material is a coupled ferroelectric-ferroelastic.

* * * * *